(12) United States Patent
Lim et al.

(10) Patent No.: US 11,187,756 B2
(45) Date of Patent: Nov. 30, 2021

(54) APPARATUS AND METHOD FOR ACQUIRING DEGRADATION INFORMATION OF LITHIUM-ION BATTERY CELL

(71) Applicant: LG CHEM, LTD., Seoul (KR)

(72) Inventors: Jin-Hyung Lim, Daejeon (KR); Du-Seong Yoon, Daejeon (KR); Won-Tae Joe, Daejeon (KR)

(73) Assignee: LG Chem, Ltd., Seoul-si (KR)

( * ) Notice: Subject to any disclaimer, the term of this patent is extended or adjusted under 35 U.S.C. 154(b) by 189 days.

(21) Appl. No.: 16/487,270

(22) PCT Filed: Sep. 6, 2018

(86) PCT No.: PCT/KR2018/010437
§ 371 (c)(1),
(2) Date: Aug. 20, 2019

(87) PCT Pub. No.: WO2019/066294
PCT Pub. Date: Apr. 4, 2019

(65) Prior Publication Data
US 2020/0018799 A1    Jan. 16, 2020

(30) Foreign Application Priority Data
Sep. 28, 2017 (KR) .................. 10-2017-0126535

(51) Int. Cl.
*G01R 31/392* (2019.01)
*G01R 31/3842* (2019.01)
(Continued)

(52) U.S. Cl.
CPC ....... *G01R 31/392* (2019.01); *G01R 31/3648* (2013.01); *G01R 31/3842* (2019.01);
(Continued)

(58) Field of Classification Search
CPC . H02J 7/0048; G01R 31/392; G01R 31/3842; G01R 31/3648; G01R 31/36;
(Continued)

(56) References Cited

U.S. PATENT DOCUMENTS

2012/0105068 A1    5/2012 Wang et al.
2012/0105069 A1    5/2012 Wang et al.
(Continued)

FOREIGN PATENT DOCUMENTS

CN    104597402 A    5/2015
CN    104931886 A    9/2015
(Continued)

OTHER PUBLICATIONS

Extended European Search Report dated Apr. 30, 2020, issued in corresponding European Application No. 18862145.2.
(Continued)

*Primary Examiner* — Yoshihisa Ishizuka
*Assistant Examiner* — Carter W Ferrell
(74) *Attorney, Agent, or Firm* — Morgan, Lewis & Bockius LLP

(57) ABSTRACT

Provided are an apparatus and method of obtaining degradation information of a lithium ion battery cell. The apparatus according to an embodiment estimates a first positive electrode usage region related to a first state of health of the lithium ion battery cell. The apparatus estimates a second positive electrode usage region related to a second state of health of the lithium ion battery cell. Then, the apparatus calculates an amount of change of maximum storage capacity of a positive electrode of the lithium ion battery cell with respect to a usage period from the first state of health to the second state of health, based on the first positive electrode usage region and the second positive electrode usage region.

8 Claims, 8 Drawing Sheets

(51) Int. Cl.
*G01R 31/36* (2020.01)
*H01M 10/0525* (2010.01)
*G01R 31/396* (2019.01)

(52) U.S. Cl.
CPC ...... *G01R 31/396* (2019.01); *H01M 10/0525* (2013.01); *Y02E 60/10* (2013.01)

(58) Field of Classification Search
CPC ............... G01R 31/367; G01R 31/374; G01R 31/3835; G01R 31/389; G01R 31/378; G01R 31/3828; G01R 31/387; G01R 31/396; G01R 31/382; G01R 31/385; Y02E 60/10; H01M 10/0525; H01M 10/48; H01M 10/486; H10M 50/569; Y02T 10/70

See application file for complete search history.

(56) References Cited

U.S. PATENT DOCUMENTS

| | | | |
|---|---|---|---|
| 2012/0293131 A1 | 11/2012 | Nakamura et al. | |
| 2013/0030739 A1 | 1/2013 | Takahashi et al. | |
| 2013/0076363 A1 | 3/2013 | Takahashi et al. | |
| 2013/0099794 A1 | 4/2013 | Takahashi et al. | |
| 2013/0162218 A1 | 6/2013 | Kang et al. | |
| 2013/0314050 A1* | 11/2013 | Matsubara | H02J 7/00 320/134 |
| 2013/0317771 A1 | 11/2013 | Laskowsky et al. | |
| 2013/0335031 A1 | 12/2013 | Joe et al. | |
| 2015/0066407 A1 | 3/2015 | Joe et al. | |
| 2015/0120225 A1 | 4/2015 | Kim | |
| 2015/0268309 A1 | 9/2015 | Kim | |
| 2015/0364794 A1* | 12/2015 | Nakazawa | H01M 4/364 429/200 |
| 2016/0259011 A1 | 9/2016 | Joe | |
| 2017/0104347 A1 | 4/2017 | Shimonishi et al. | |
| 2017/0146610 A1 | 5/2017 | Cha et al. | |
| 2017/0263984 A1 | 9/2017 | Fujita et al. | |
| 2018/0313906 A1* | 11/2018 | Takahashi | G01R 31/378 |

FOREIGN PATENT DOCUMENTS

| | | |
|---|---|---|
| JP | 2011-220917 A | 11/2011 |
| JP | 6054788 B2 | 12/2016 |
| JP | 2017-016774 A | 1/2017 |
| KR | 10-2012-0123346 A | 11/2012 |
| KR | 10-2013-0136800 A | 12/2013 |
| KR | 10-1487494 B1 | 1/2015 |
| KR | 10-2016-0029054 A | 3/2016 |
| KR | 10-2016-0048585 A | 5/2016 |
| KR | 10-2017-0034191 A | 3/2017 |
| WO | 2011/125213 A1 | 10/2011 |

OTHER PUBLICATIONS

International Search Report dated Dec. 20, 2018, issued in corresponding International Application No. PCT/KR2018/010437.
Office Action dated Dec. 2, 2020, issued in corresponding Chinese Patent Application No. 201880006759.7.
Office Action dated Oct. 6, 2020, issued in corresponding Japanese Patent Application No. 2019-538218.

* cited by examiner

APPARATUS AND METHOD FOR ACQUIRING DEGRADATION INFORMATION OF LITHIUM-ION BATTERY CELL

TECHNICAL FIELD

The present disclosure relates to an apparatus and method of nondestructively obtaining information associated with degradation of a lithium ion battery cell caused by repetitive charging and discharging.

The present application claims priority to Korean Patent Application No. 10-2017-0126535 filed on Sep. 28, 2017 in the Republic of Korea, the disclosures of which are incorporated herein by reference.

BACKGROUND ART

Recently, demands for portable electronic products, such as laptop computers, video cameras, portable phones, etc. have rapidly increased, and development of electric cars, batteries for energy storage, robots, and satellites, etc. has regularized, and thus studies on high performance batteries capable of repetitive charging and discharging are actively conducted.

Currently commercialized batteries include nickel cadmium batteries, nickel hydrogen batteries, nickel zinc batteries, lithium ion batteries, etc., and thereamong, the lithium ion batteries are in the limelight because the lithium ion batteries have almost no memory effect compared to a nickel-based battery and thus is free of being charged and discharged, has a very low self-discharge rate, and has high energy density.

A lithium ion battery cell basically includes a positive electrode, a negative electrode, and an electrolyte. The lithium ion battery cell is charged and discharged when lithium ions involving in an electrochemical reaction of the lithium ion battery cell move from the positive electrode to the negative electrode or from the negative electrode to the positive electrode.

Meanwhile, a side reaction occurs between the positive electrode, the negative electrode, and an electrolyte solution of the lithium ion battery cell, and such a side reaction occurs not only when the lithium ion battery cell is in a use state, but also when in a storage state. An SEI (Solid Electrolyte Interface) is generated as a result of the side reaction, which denotes that an amount of lithium ions involving in charging and discharging inside the lithium ion battery cell is gradually decreasing. Also, the SEI (Solid Electrolyte Interface) forms a film on a negative electrode surface, which is one of causes that degrades the lithium ion battery cell. As the degradation of the lithium ion battery cell is progressed, a usage region of each of a positive electrode half-cell and a negative electrode half-cell is shifted. In order to safely use the lithium ion battery cell, it is necessary to obtain information about the usage region of each of the positive electrode half-cell and the negative electrode half-cell according to the degradation of the lithium ion battery cell, and control charging and discharging of the lithium ion battery cell based thereon.

However, only information about a full-cell usage region including a voltage window and the like at both ends of the lithium ion battery cell is roughly obtained via a conventional nondestructive analysis method, and it is difficult to obtain information associated with the usage region of each of the positive electrode half-cell and the negative electrode half-cell of the lithium ion battery cell.

A 3-electrode test method has been suggested to solve the above problems. When the 3-electrode test method is used, information associated with the usage region and maximum storage capacity of each of the positive electrode half-cell and the negative electrode half-cell of the lithium ion battery cell may be obtained by comparing electric potential of each of the positive electrode and the negative electrode of the lithium ion battery cell with electric potential of a reference electrode. However, in order to perform the 3-electrode test method, there is an inconvenience of manufacturing a lithium ion battery cell into which a reference electrode is inserted. Moreover, the reference electrode may affect electrochemical characteristics between the positive electrode, the negative electrode, and the electrolyte of the lithium ion battery cell, and thus a result measured from the lithium ion battery cell having the reference electrode may not coincide with actual electrochemical characteristics of the lithium ion battery cell without a reference electrode.

DISCLOSURE

Technical Problem

The present disclosure is designed to solve the problems of the related art, and therefore the present disclosure is directed to providing an apparatus and method for obtaining information indicating a positive electrode usage region and a negative electrode usage region of a lithium ion battery cell without having to disassemble the lithium ion battery cell to attach a reference electrode or the like.

Also, the present disclosure is directed to providing an apparatus and method of determining capacity information of each of a positive electrode and a negative electrode according to degradation of a lithium battery cell, based on information indicating a positive electrode usage region and a negative electrode usage region obtained respectively from two different SOH (state of health) with progress of the degradation of the lithium ion battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure for achieving the above objects are as follows.

In one aspect of the present disclosure, there is provided an apparatus for obtaining degradation information of a lithium ion battery cell, the apparatus including: a sensing unit configured to measure a full-cell open circuit voltage and a current of the lithium ion battery cell; and a control unit operably coupled to the sensing unit, wherein the control unit is configured to: estimate a first positive electrode usage region of the lithium ion battery cell, based on a full-cell open circuit voltage and a current measured by the sensing unit while the lithium ion battery cell is in a first state of health; estimate a second positive electrode usage region of the lithium ion battery cell, based on an open circuit voltage and a current measured by the sensing unit while the lithium ion battery cell is in a second state of health degraded compared to the first state of health; and calculate an amount of change of maximum storage capacity of a positive electrode of the lithium ion battery cell with respect to an usage period from the first state of health to the second state of health, based on the first positive electrode usage region and the second positive electrode usage region.

Here, the first positive electrode usage region may be defined by a first positive electrode upper limit value and a first positive electrode lower limit value, and the second positive electrode usage region may be defined by a second positive electrode upper limit value and a second positive electrode lower limit value, wherein the first positive electrode upper limit value may correspond to an amount of lithium ions stored in the positive electrode of the lithium ion battery cell when a state of charge of the lithium ion battery cell in the first state of health is at a pre-determined upper limit value, the first positive electrode lower limit value may correspond to an amount of lithium ions stored in the positive electrode of the lithium ion battery cell when the state of charge of the lithium ion battery cell in the first state of health is at a pre-determined lower limit value, the second positive electrode upper limit value may correspond to an amount of lithium ions stored in the positive electrode of the lithium ion battery cell when the state of charge of the lithium ion battery cell in the second state of health is at the pre-determined upper limit value, and the second positive electrode lower limit value may correspond to an amount of lithium ions stored in the positive electrode of the lithium ion battery cell when the state of charge of the lithium ion battery cell in the second state of health is at the pre-determined lower limit value.

According to an aspect, the control unit may be configured to calculate the amount of change of the maximum storage capacity of the positive electrode of the lithium ion battery cell with respect to the usage period by using an equation below:

$$\Delta Q_P^t = Q_{P\_SOH1}^t - Q_{P\_SOH2}^t = \frac{Q_{F\_SOH1}^t}{p_{f\_SOH1} - p_{i\_SOH1}} - \frac{Q_{F\_SOH2}^t}{p_{f\_SOH2} - p_{i\_SOH2}},$$

wherein $\Delta Q_P^t$: the amount of change of the maximum storage capacity of the positive electrode of the lithium ion battery cell, $Q_{P\_SOH1}^t$: maximum storage capacity of the positive electrode of the lithium ion battery cell in the first state of health, $Q_{P\_SOH2}^t$: maximum storage capacity of the positive electrode of the lithium ion battery cell in the second state of health, $p_{f\_SOH1}$: the first positive electrode upper limit value,
$p_{i\_SOH1}$: the first positive electrode lower limit value,
$p_{f\_SOH2}$: the second positive electrode upper limit value,
$p_{i\_SOH2}$: the second positive electrode lower limit value,
$Q_{F\_SOH1}^t$: maximum storage capacity of the lithium ion battery cell in the first state of health, and
$Q_{F\_SOH2}^t$: maximum storage capacity of the lithium ion battery cell in the second state of health.

According to another aspect, the control unit may be configured to calculate an amount of change of maximum discharge capacity of the positive electrode of the lithium ion battery cell with respect to the usage period by using an equation below:

$$\Delta Q_{residual\_P} = Q_{P\_SOH2}^t(1 - p_{f\_SOH2}) - Q_{P\_SOH1}^t(1 - p_{f\_SOH1})$$

wherein $\Delta Q_{residual\_P}$: the change of the maximum discharge capacity of the positive electrode of the lithium ion battery cell, wherein the amount of change of the maximum discharge capacity of the positive electrode of the lithium ion battery cell may correspond to a total amount of lithium ions consumed by a side reaction between the positive electrode and an electrolyte solution during the usage period.

In another aspect of the present disclosure, there is also provided an apparatus for obtaining degradation information of a lithium ion battery cell, the apparatus including: a sensing unit configured to measure a full-cell open circuit voltage and a current of the lithium ion battery cell; and a control unit operably coupled to the sensing unit, wherein the control unit is configured to: estimate a first negative electrode usage region of the lithium ion battery cell, based on an open circuit voltage and a current measured by the sensing unit while the lithium ion battery cell is in a first state of health, estimate a second negative electrode usage region of the lithium ion battery cell, based on a full-cell open circuit voltage and a current measured by the sensing unit while the lithium ion battery cell is in a second state of health degraded compared to the first state of health, and calculate an amount of change of maximum storage capacity of the lithium ion battery cell with respect to a period from the first state of health to the second state of health, based on the first negative electrode usage region and the second negative electrode usage region.

Here, the first negative electrode usage region may be defined by a first negative electrode upper limit value and a first negative electrode lower limit value, and the second negative electrode usage region may be defined by a second negative electrode upper limit value and a second negative electrode lower limit value, wherein the first negative electrode upper limit value may correspond to an amount of lithium ions stored in the negative electrode of the lithium ion battery cell when a state of charge of the lithium ion battery cell in the first state of health is at a pre-determined upper limit value, the first negative electrode lower limit value may correspond to an amount of lithium ions stored in the negative electrode of the lithium ion battery cell when the state of charge of the lithium ion battery cell in the first state of health is at a pre-determined lower limit value, the second negative electrode upper limit value may correspond to an amount of lithium ions stored in the negative electrode of the lithium ion battery cell when the state of charge of the lithium ion battery cell in the second state of health is at the pre-determined upper limit value, and the second negative electrode lower limit value may correspond to an amount of lithium ions stored in the negative electrode of the lithium ion battery cell when the state of charge of the lithium ion battery cell in the second state of health is at the pre-determined lower limit value.

According to an aspect, the control unit may be configured to calculate the amount of change of the maximum storage capacity of the negative electrode of the lithium ion battery cell by using an equation below:

$$\Delta Q_N^t = Q_{N\_SOH1}^t - Q_{N\_SOH2}^t = \frac{Q_{F\_SOH1}^t}{n_{f\_SOH1} - n_{i\_SOH1}} - \frac{Q_{F\_SOH2}^t}{n_{f\_SOH2} - n_{i\_SOH2}},$$

wherein $\Delta Q_N^t$: the amount of change of the maximum storage capacity of the negative electrode of the lithium ion battery cell, $Q_{N\_SOH1}^t$: maximum storage capacity of the negative electrode of the lithium ion battery cell in the first state of health, $Q_{N\_SOH2}^{t}$: maximum storage capacity of the negative electrode of the lithium ion battery cell in the first state of health, battery cell in the second state of health, $n_{f\_SOH1}$: the first negative electrode upper limit value, $n_{i\_SOH1}$: the first negative electrode lower limit value, $n_{f\_SOH2}$: second negative electrode upper limit value, $n_{i\_SOH2}$: the second negative electrode lower limit value, $Q_{F\_SOH1}^{t}$: maximum storage capacity of the lithium ion battery cell in the first state of health, and $Q_{F\_SOH2}^{t}$: maximum storage capacity of the lithium ion battery cell in the second state of health.

According to another aspect, the controller may be configured to calculate an amount of change of maximum discharge capacity of the negative electrode of the lithium ion battery cell with respect to the usage period by using an equation below:

$$\Delta Q_{residual\_N} = Q_{N\_SOH1}^{t} \cdot n_{f\_SOH1} - Q_{N\_SOH2}^{t} \cdot n_{f\_SOH2},$$

wherein $\Delta Q_{residual\_N}$: the amount of change of the maximum discharge capacity of the negative electrode of the lithium ion battery cell, wherein the amount of change of the maximum discharge capacity of the negative electrode of the lithium ion battery cell corresponds to a total amount of lithium ions consumed by a side reaction between the negative electrode and an electrolyte solution during the usage period.

According to another aspect, the apparatus may further include a communication unit configured to externally transmit the obtained degradation information.

In another aspect of the present disclosure, there is also provided a battery pack including the apparatus.

Advantageous Effects

According to at least one of embodiments of the present disclosure, information about a usage region of a positive half-cell and a usage region of a negative electrode half cell of a lithium ion battery cell may be obtained without having to disassemble the lithium ion battery cell to attach a reference electrode or the like.

Also, in the present disclosure, a lithium ion battery cell may determine capacity information of each of a positive electrode and a negative electrode according to degradation of the lithium ion battery cell, based on information about a positive electrode usage region and a negative electrode usage region obtained respectively from two different SOH (state of health).

Effects of the present disclosure are not limited by the effects described above, and other effects that are not mentioned will become apparent to one of ordinary skill in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODE FOR DISCLOSURE

It should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Also, in the description of the present disclosure, certain detailed explanations of related art or functions are omitted when it is deemed that they may unnecessarily obscure the essence of the disclosure.

Throughout the specification, when a portion "includes" a component, it is intended to indicate that another component may be further included instead of excluding the other component, unless otherwise indicated. Also, the term such as "control unit" herein denotes a unit of processing at least one function or operation, and may be embodied via hardware, software, or a combination of hardware and software.

In addition, throughout the specification, when a portion is "connected" to another portion, they may be not only "directly connected", but may also be "indirectly connected" with another device therebetween.

Hereinafter, for convenience of description, a battery cell is referred to as a 'cell'. Also, various voltage profiles described below are not necessarily limited to having continuous shapes, and may have discrete shapes.

Figure 1:
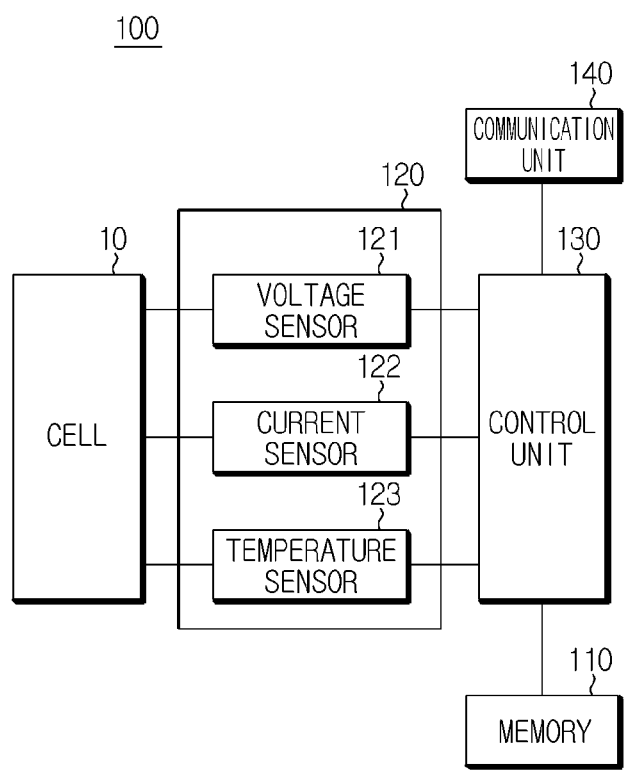
FIG. 1 is a diagram showing a functional configuration of an apparatus for obtaining degradation information of a lithium ion battery cell, according to an embodiment of the present disclosure.

FIG. 1 is a diagram showing a functional configuration of an apparatus 100 for obtaining degradation information of a lithium ion battery cell, according to an embodiment of the present disclosure.

Referring to FIG. 1, the apparatus 100 includes a memory 110, a sensing unit 120, and a control unit 130.

The memory 110 is configured to store reference information pre-provided with respect to each of a plurality of reference cells. The reference information indicates performance of each reference cell, and is used as a criterion of comparison for obtaining degradation information of a lithium ion battery cell 10 described later. The reference information includes a positive electrode half-cell profile, a negative electrode half-cell profile, a positive electrode upper limit value, a positive electrode lower limit value, a negative electrode upper limit value, and a negative electrode lower limit value with respect to each reference cell. The reference information is obtained via a prior experiment with respect to each reference cell. Any one of the plurality of reference cells may have a state of health different from at least one of the remaining reference cells.

In detail, the positive electrode half-cell profile indicates a change of an open circuit voltage of a positive electrode of the reference cell according to a change of an amount of lithium ions stored in the positive electrode of the reference cell. For example, as charging of the reference cell progresses, the amount of lithium ions stored in the positive electrode of the reference cell is gradually decreased and thus electric potential of the positive electrode is gradually increased.

The negative electrode half-cell profile indicates a change of an open circuit voltage of a negative electrode of the reference cell according to a change of an amount of lithium ions stored in the negative electrode of the reference cell. For example, as the charging of the reference cell progresses, the amount of lithium ions stored in the negative electrode of the reference cell is gradually increased and thus electric potential of the negative electrode is gradually decreased.

The positive electrode upper limit value of the reference cell corresponds to the amount of lithium ions stored in the positive electrode of the reference cell at an upper limit value (for example, 100%) of a certain state of charge (SOC) range (for example 0% to 100%). Specifically, the positive electrode upper limit value of the reference cell indicates a stoichiometric value in which, based on a first threshold value indicating a maximum amount of lithium ions storable in the positive electrode of the reference cell, a value obtained by subtracting, from the first threshold value, a first experiment value indicating an amount of lithium ions stored in the positive electrode of the reference cell at a point of time when SOC of the reference cell reached an upper limit value is indicated in a range of 0 to 1. For example, when the first experiment value is 10% of the first threshold value, the positive electrode upper limit value of the reference cell=(the first threshold value−the first experiment value)/the first threshold value=(100%−10%)/100%=0.90.

The positive electrode lower limit value of the reference cell corresponds to the amount of lithium ions stored in the positive electrode of the reference cell at a lower limit value (for example, 0%) of a certain SOC range. Specifically, the positive electrode lower limit value of the reference cell indicates a stoichiometric value in which, based on the first threshold value, a value obtained by subtracting, from the first threshold value, a second experiment value indicating an amount of lithium ions stored in the positive electrode of the reference cell at a point of time when SOC of the reference cell reached a lower limit value of the certain SOC range is indicated in a range of 0 to 1. For example, when the second experiment value is 80% of the first threshold value, the positive electrode lower limit value of the reference cell=(the first threshold value−the second experiment value)/the first threshold value=(100%−80%)/100%=0.20. Since the amount of lithium ions stored in the positive electrode of the reference cell increases as the SOC of the reference cell decreases, it would be obvious to one of ordinary skill in the art that the positive electrode lower limit value of the reference cell is smaller than the positive electrode upper limit value of the reference cell.

The negative electrode upper limit value of the reference cell corresponds to the amount of lithium ions stored in the negative electrode of the reference cell at an upper limit value of a certain SOC range. In detail, the negative electrode upper limit value of the reference cell indicates a stoichiometric value indicating, based on a second threshold value indicating a maximum amount of lithium ions storable in the negative electrode of the reference cell, a third experiment value indicating an amount of lithium ions stored in the negative electrode of the reference cell at a point of time when SOC of the reference cell reached an upper limit value of the certain SOC range, in a range of 0 to 1. For example, when the third experiment value is 95% of the second threshold value, the negative electrode upper limit value of the reference cell=the third threshold value/the second experiment value=95%/100%=0.95.

The negative electrode lower limit value of the reference cell corresponds to the amount of lithium ions stored in the negative electrode of the reference cell at a lower limit value of the certain SOC range. In detail, the negative electrode lower limit value of the reference cell indicates a stoichiometric value indicating, based on the second threshold value, a fourth experiment value indicating an amount of lithium ions stored in the negative electrode of the reference cell at a point of time when SOC of the reference cell reached a lower limit value of the certain SOC range, in a range of 0 to 1. For example, when the fourth experiment value is 5% of the second threshold value, the negative electrode lower limit value of the reference cell=the fourth threshold value/the second experiment value=5%/100%=0.05. Since the amount of lithium ions stored in the negative electrode of the reference cell decreases as the SOC of the reference cell decreases, it would be obvious to one of ordinary skill in the art that the negative electrode lower limit value of the reference cell is smaller than the negative electrode upper limit value of the reference cell.

Also, the memory 110 may additionally store various types of data, instructions, and software necessary for overall operations. Such a memory 110 may include a storage medium corresponding to at least one type from among a flash memory type, a hard disk type, a solid state disk (SSD) type, a silicon disk drive (SDD) type, a multimedia card micro type, a random access memory (RAM), a static random access memory (SRAM), a read-only memory (ROM), an electrically erasable programmable read-only memory (EEPROM), and a programmable read-only memory (PROM).

The sensing unit 120 may include at least one of a voltage sensor 121, a current sensor 122, and a temperature sensor 123. In response t a control signal provided from the control unit 130, at least one of the voltage sensor 121, the current sensor 122, and the temperature sensor 123 individually measures at least one of a voltage, a current, and a temperature of a lithium ion battery cell 10, and provide data indicating a measured value to the control unit 130.

The control unit 130 may be operably coupled to the memory 110 and the sensing unit 120. The control unit 130 is configured to nondestructively test performance of the lithium ion battery cell 10 by referring to the data and instructions stored in the memory 110 or by driving the software. The control unit 130 may execute software for at least one of measurement of a voltage, current, and temperature of the lithium ion battery cell 10, SOC calculation, SOH estimation, and temperature management.

The control unit 130 may be embodied by using, in terms of hardware, at least one of application specific integrated circuits (ASICs), digital signal processors (DSPs), digital signal processing devices (DSPDs), programmable logic devices (PLDs), field programmable gate arrays (FPGAs), microprocessors, and electric units for performing other functions.

The control unit 130 may generate a full-cell SOC-OCV profile with respect to each reference cell, based on the positive electrode half-cell profile, the negative electrode half-cell profile, the positive electrode upper limit value, the positive electrode lower limit value, the negative electrode upper limit value, and the negative electrode lower limit value of each of the plurality of reference cells. In detail, the full-cell SOC-OCV profile indicates a difference between a positive electrode open circuit voltage of the reference cell provided by the positive electrode half-cell profile and a negative electrode open circuit voltage of the reference cell provided by the negative electrode half-cell profile, i.e., profile of an open circuit voltage formed between both ends of the reference cell.

Meanwhile, aside from the plurality of reference cells, the control unit 130 may generate at least one full-cell SOC-OCV profile associated with the lithium ion battery cell 10. When a plurality of full-cell SOC-OCV profiles are generated for the lithium ion battery cell 10, each of the plurality of full-cell SOC-OCV profiles may be related to different SOHs of the lithium ion battery cell 10. Here, the lithium ion battery cell 10 may be designed and manufactured to have the same electrochemical characteristics as the reference cell.

Specifically, the control unit 130 may generate a full-cell SOC-OCV profile associated with a certain SOC range, based on voltage data indicating a full-cell open circuit voltage of the lithium ion battery cell 10 provided from the sensing unit 120 while the lithium ion battery cell 10 is in a certain SOH. In other words, a full-cell SOC-OCV profile indicates a change of open circuit voltage formed between both ends of the lithium ion battery cell 10 in the certain SOH in a certain SOC range. Here, the certain SOH may be any one of, for example, beginning of life (BOL), middle of life (MOL), and end of life (EOL).

After the generation of the full-cell SOC-OCV profile associated with the lithium ion battery cell 10 in the certain SOH is completed, the control unit 130 may estimate a positive electrode upper limit value, a positive electrode lower limit value, a negative electrode upper limit value, and a negative electrode lower limit value of the lithium ion battery cell 10 in the certain SOH, based on (i) a full-cell SOC-OCV profile associated with the plurality of reference cells provided from the reference information and (ii) the full-cell SOC-OCV profile with respect to the lithium ion battery cell 10 in the certain SOH.

Here, the positive electrode upper limit value of the lithium ion battery cell 10 corresponds to an amount of lithium ion s stored in the positive electrode of the lithium ion battery cell 10 when SOC of the lithium ion battery cell 10 is at the upper limit value. In detail, the positive electrode upper limit value of the lithium ion battery cell 10 indicates a stoichiometric value in which, based on the first threshold value, a value obtained by subtracting, from the first threshold value, a first estimation value indicating an amount of lithium ions stored in the positive electrode of the lithium ion battery cell 10 at a point of time when SOC of the lithium ion battery cell 10 reached the upper limit value is indicated in a range of 0 to 1. For example, when the first estimation value is 5% of the first threshold value, the positive electrode upper limit value of the lithium ion battery cell 10 is (100%−5%)/100%=0.95.

The positive electrode lower limit value of the lithium ion battery cell 10 corresponds to the amount of lithium ions stored in the positive electrode of the lithium ion battery cell 10 when SOC of the lithium ion battery cell 10 is at the lower limit value. In detail, the positive electrode lower limit value of the lithium ion battery cell 10 indicates a stoichiometric value in which, based on the first threshold value, a value obtained by subtracting, from the first threshold value, a second estimation value indicating an amount of lithium ions stored in the positive electrode of the lithium ion battery cell 10 at a point of time when SOC of the lithium ion battery cell 10 reached the lower limit value is indicated in a range of 0 to 1. For example, when the second estimation value is 95% of the first threshold value, the positive electrode lower limit value of the lithium ion battery cell 10 is (100%−95%)/100%=0.05. Since the amount of lithium ions stored in the positive electrode of the lithium ion battery cell 10 increases as the SOC of the lithium ion battery cell 10 decreases, it would be obvious to one of ordinary skill in the art that the positive electrode lower limit value of the lithium ion battery cell 10 is smaller than the positive electrode upper limit value.

The negative electrode upper limit value of the lithium ion battery cell 10 corresponds to the amount of lithium ions stored in the negative electrode of the lithium ion battery cell 10 when SOC of the lithium ion battery cell 10 is at the upper limit value. In detail, the negative electrode upper limit value of the lithium ion battery cell 10 indicates a stoichiometric value indicating, based on the second threshold value, a third estimation value indicating an amount of lithium ions stored in the negative electrode of the lithium ion battery cell 10 at a point of time when SOC of the lithium ion battery cell 10 reached the upper limit value, in a range of 0 to 1. For example, when the third estimation value is 90% of the second threshold value, the negative electrode upper limit value of the lithium ion battery cell 10 is 90%/100%=0.90.

The negative electrode lower limit value of lithium ion battery cell 10 corresponds to the amount of lithium ions stored in the negative electrode of the lithium ion battery cell 10 when SOC of the lithium ion battery cell 10 is at the lower limit value. In detail, the negative electrode lower limit value of the lithium ion battery cell 10 indicates a stoichiometric value indicating, based on the second threshold value, a fourth estimation value indicating an amount of lithium ions stored in the negative electrode of the lithium ion battery cell 10 at a point of time when SOC of the lithium ion battery cell 10 reached the lower limit value, in a range of 0 to 1. For example, when the fourth estimation value is 10% of the second threshold value, the negative electrode lower limit value of the lithium ion battery cell 10 is 10%/100%=0.10. Since the amount of lithium ions stored in the negative electrode of the lithium ion battery cell 10 decreases as the SOC of the lithium ion battery cell 10 decreases, it would be obvious to one of ordinary skill in the art that the negative electrode lower limit value of the lithium ion battery cell 10 is smaller than the negative electrode upper limit value.

Hereinafter, it is assumed that the positive electrode and the negative electrode of each of the plurality of reference cells and the lithium ion battery cell 10 are $Li_xMeO_2$ and $Li_yC_6$. Here, 'x' used as a subscript is a stoichiometric number indicating the amount of lithium ions stored in the positive electrode, and 'y' used as a subscript is a stoichiometric number indicating the amount of lithium ions stored in the negative electrode. Also, Me may be a metal element, such as Ni, Mn, Mg, or Al. Also, the certain SOC range is assumed to be 0 to 1. It would have easily understood by one of ordinary skill in the art that SOC of the lithium ion battery cell 10 being 1 means that a both-end voltage of the lithium ion battery cell 10 reached a pre-determined upper voltage and thus reached a fully charged state, and SOC of the lithium ion battery cell 10 being 0 means that both-end voltage of the lithium ion battery cell 10 reached a pre-determined lower voltage and thus reached a fully discharged state.

The apparatus 100 may further include a communication unit 140. The communication unit 140 outputs data read, processed, and/or calculated by the control unit 130 in a form recognizable by a user. For example, the communication unit 140 may include a display that outputs the data processed by the control unit 130 in a visual form. As another example, the communication unit 140 may include a speaker that outputs data read, processed, and/or calculated by the apparatus 100 in an auditory form. The user may be provided with degradation information of the lithium ion battery cell 10 through the communication unit 140. Here, the degradation information includes at least one of capacity information of a positive electrode half-cell and capacity information of a negative electrode half-cell according to degradation of the lithium ion battery cell 10.

Figure 2:
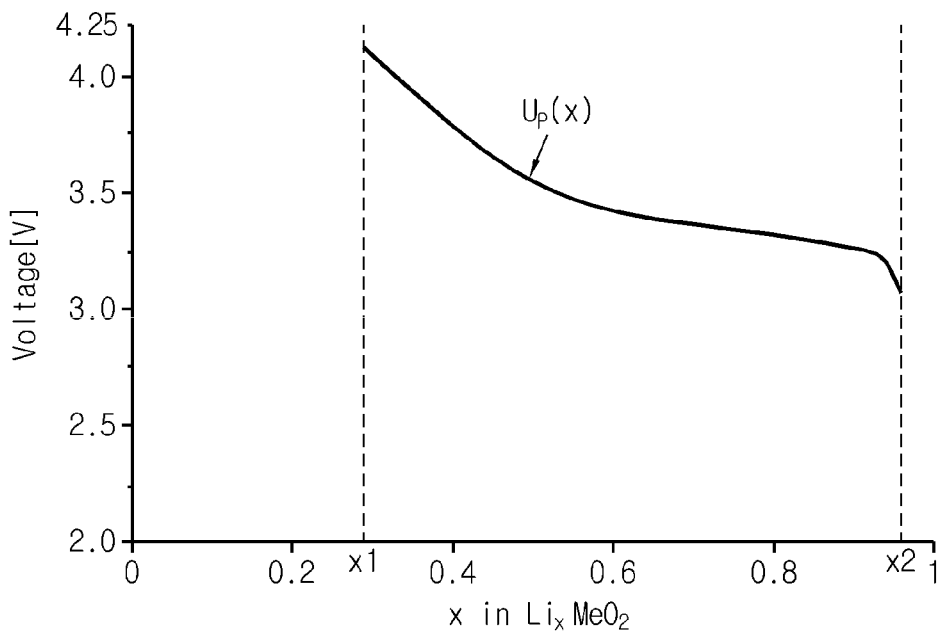
FIGS. 2 and 3 are graphs showing positive electrode half-cell profiles of a reference cell described with reference to FIG. 1.
Figure 3:
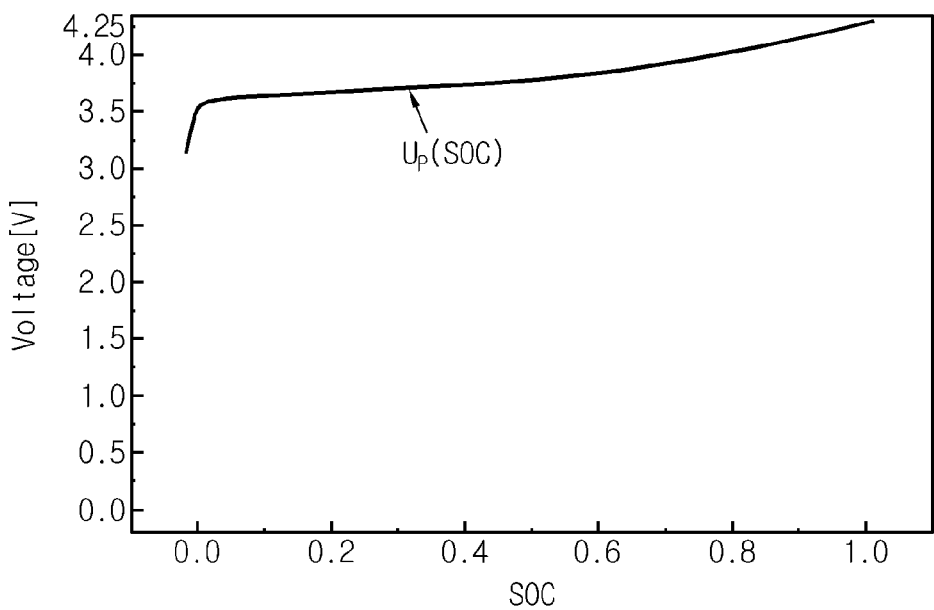

FIGS. 2 and 3 are graphs showing a positive electrode half-cell profile of the reference cell described with reference to FIG. 1.

Referring to FIG. 2, through a prior experiment, a positive electrode half-cell profile $U_P(x)$ indicating a change of a positive electrode open circuit voltage measured while an amount x of lithium ions stored in a positive electrode $Li_xMeO_2$ of any one certain reference cell among a plurality of reference cells is adjusted in a range between a first experiment value x1 and a second experiment value x2 is determined. Here, the positive electrode open circuit voltage of the reference cell is a difference between positive electrode electric potential and reference electric potential of the reference cell. Upon checking the positive electrode half-cell profile $U_P(x)$ shown in FIG. 2, it is determined that the positive electrode open circuit voltage of the reference cell is gradually decreased as the amount x of lithium ions stored in the positive electrode of the reference cell is increased from the first experiment value x1 to the second experiment value x2. x indicating the amount of lithium ions stored in the positive electrode of the reference cell may be determined based on Equation 1 below.

$$x=P_i+(1-SOC)\times(P_f-P_i)$$ [Equation 1]

In Equation 1, $P_f$ indicates the positive electrode upper limit value, $P_i$ indicates the positive electrode lower limit value, and SOC indicates a state of charge of the reference cell. At this time, since $P_f$ and $P_i$ are pre-determined constants, x depends on a change of SOC. In other words, once any one of x and SOC is known, the other one is known. Referring to FIG. 3 together with FIG. 2, the control unit 130 may convert the positive electrode half-cell profile $U_P(x)$ indicating a relationship between the amount of lithium ions stored in the positive electrode of the reference cell and the positive electrode open circuit voltage of the reference cell into another positive electrode half-cell profile $U_P(SOC)$ indicating a relationship between SOC of the reference cell and the positive electrode open circuit voltage of the reference cell.

Figure 4:
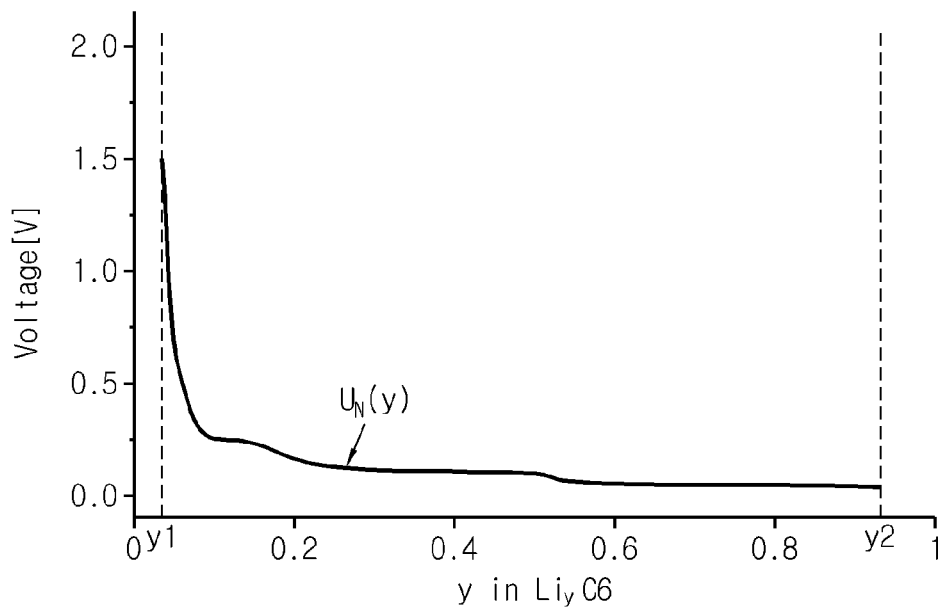
FIGS. 4 and 5 are graphs showing a negative electrode half-cell profile described with reference to FIG. 1.
Figure 5:
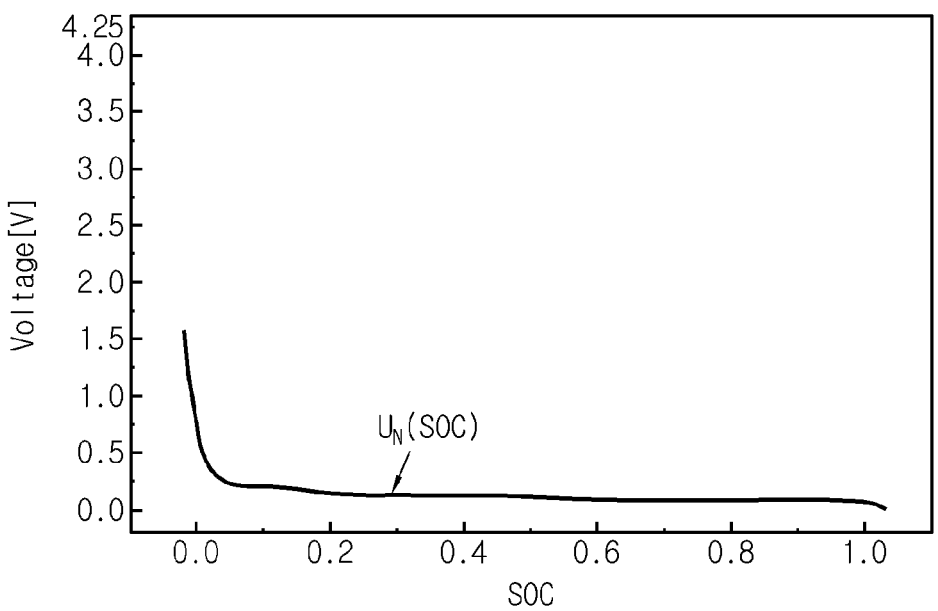

FIGS. 4 and 5 are graphs showing negative electrode half-cell profiles described with reference to FIG. 1.

Referring to FIG. 4, through a prior experiment, a negative electrode half-cell profile $U_N(y)$ indicating a change of a negative electrode open circuit voltage measured while an amount y of lithium ions stored in a negative electrode $Li_yC_6$ of the certain reference cell having $U_P(x)$ of FIG. 3 is adjusted in a range between a third experiment value y1 and a fourth experiment value y2 is determined. Here, the negative electrode open circuit voltage of the reference cell is a difference between negative electrode electric potential and reference electric potential of the reference cell. Upon checking the negative electrode half-cell profile $U_N(y)$ shown in FIG. 4, it is determined that the negative electrode open circuit voltage of the reference cell is gradually decreased as y indicating the amount of lithium ions stored in the negative electrode of the reference cell is increased from the third experiment value y1 to the fourth experiment value y2. y indicating the amount of lithium ions stored in the negative electrode of the reference cell may be determined based on Equation 2 below.

$$y=N_i+SOC\times(N_f-N_i)$$ [Equation 2]

In Equation 2, $N_f$ indicates the negative electrode upper limit value, $N_i$ indicates the negative electrode lower limit value, and SOC indicates a state of charge of the reference cell. At this time, since $N_f$ and $N_i$ are pre-determined constants, y depends on a change of SOC. In other words, once any one of y and SOC is known, the other one is known. Referring to FIG. 5 together with FIG. 4, the control unit 130 may convert the negative electrode half-cell profile $U_N(y)$ indicating a relationship between the amount of lithium ions stored in the negative electrode of the reference cell and the negative electrode open circuit voltage of the reference cell into another negative electrode half-cell profile $U_N(SOC)$ indicating a relationship between SOC of the reference cell and the negative electrode open circuit voltage of the reference cell.

Figure 6:
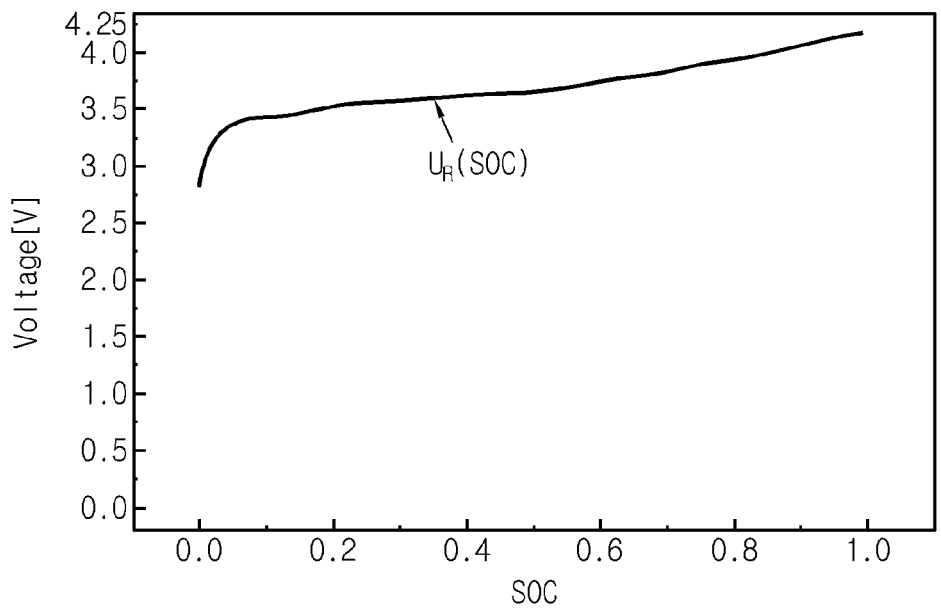
FIG. 6 is a graph showing a full-cell SOC-OCV profile of the reference cell described with reference to FIG. 1.

FIG. 6 is a graph showing a full-cell profile of the reference cell described with reference to FIG. 1.

Referring to FIG. 6, a full-cell SOC-OCV profile $U_R(SOC)$ of the reference cell is shown. The full-cell SOC-OCV profile $U_R(SOC)$ corresponds to a difference between the positive electrode half-cell profile $U_P(SOC)$ shown in FIG. 3 and the negative electrode half-cell profile $U_N(SOC)$ shown in FIG. 5, in a pre-determined SOC range 0 to 1. As described above, the positive electrode half-cell profile $U_P(SOC)$ is related to the positive electrode half-cell profile $U_P(x)$, the positive electrode upper limit value $P_f$, and the positive electrode lower limit value $P_i$, and the negative electrode half-cell profile $U_N(SOC)$ is related to the negative electrode half-cell profile $U_N(y)$, the negative electrode upper limit value $N_f$, and the negative electrode lower limit value $N_i$. Accordingly, the control unit 130 may generate a full-cell SOC-OCV profile of each reference full cell, based on the positive electrode half-cell profile, the negative electrode half-cell profile, the positive electrode upper limit value, the positive electrode lower limit value, the negative electrode upper limit value, and the negative electrode lower limit value of each of the plurality of reference cells included in the reference information.

Figure 7:
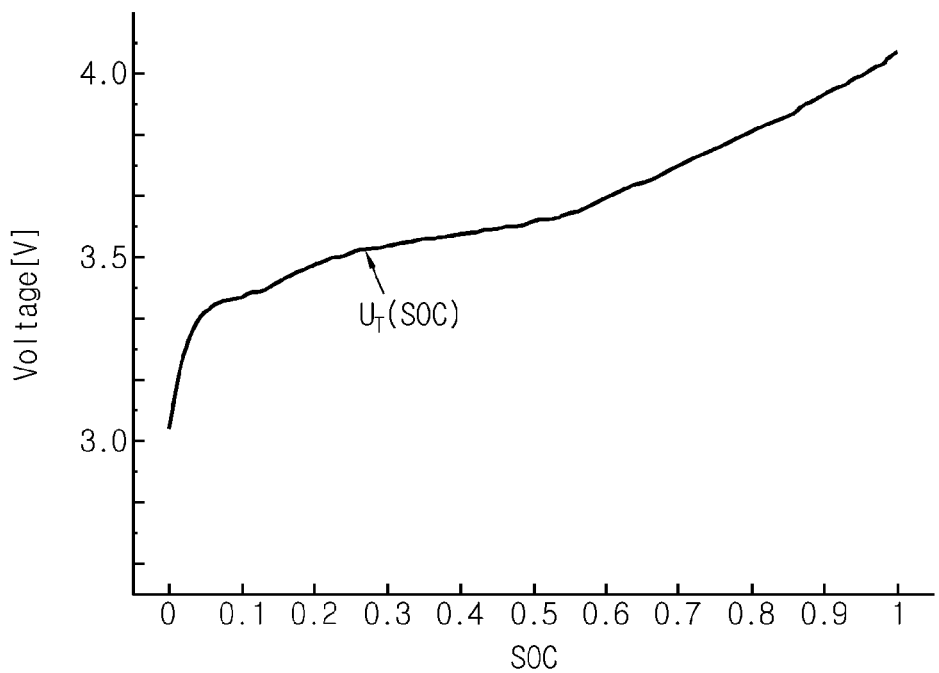
FIG. 7 shows a full-cell SOC-OCV profile of a lithium ion battery cell, according to an embodiment of the present disclosure.
Figure 8:
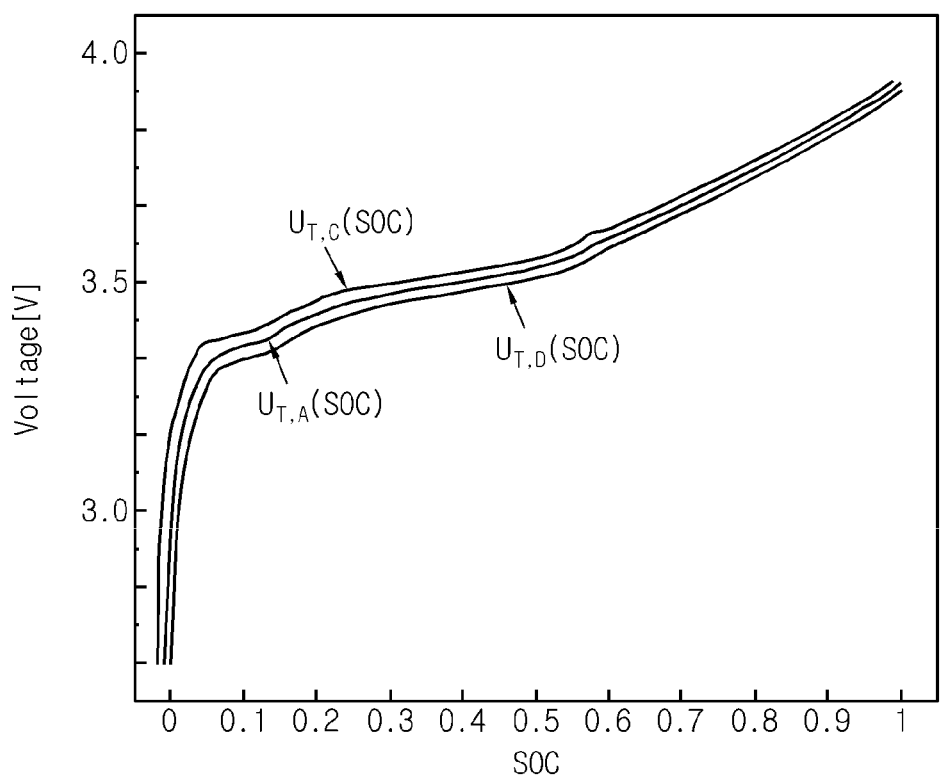
FIGS. 8 and 9 illustrate techniques for measuring a full-cell open circuit voltage of a lithium ion battery cell.
Figure 9:
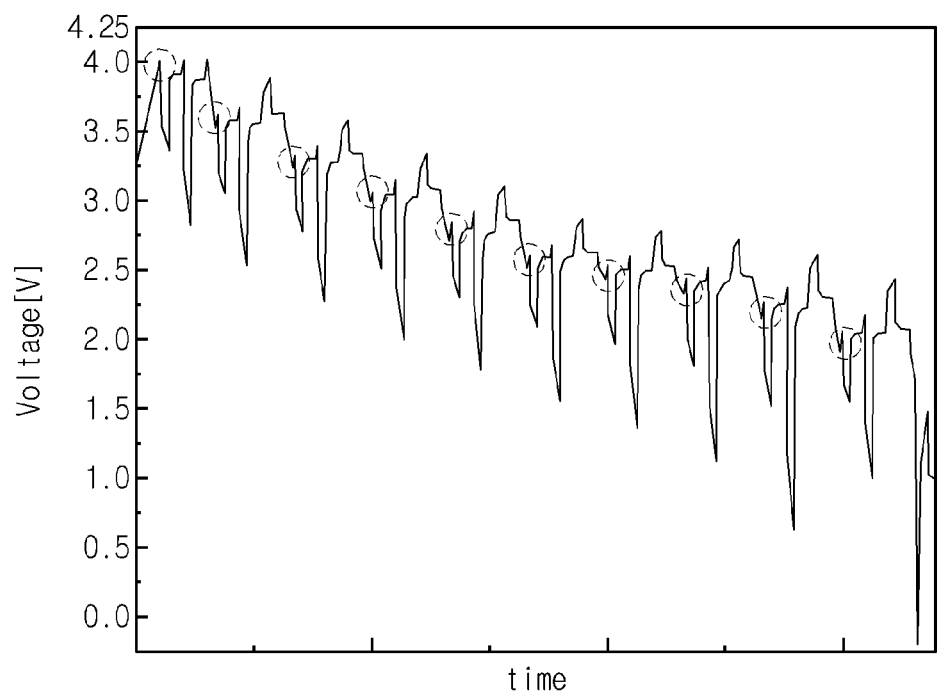

FIG. 7 shows a full-cell profile of a lithium ion battery cell, according to an embodiment of the present disclosure, and FIGS. 8 and 9 illustrate techniques for measuring a full-cell open circuit voltage of a lithium ion battery cell.

Referring to FIG. 7, a full-cell SOC-OCV profile $U_T(SOC)$ associated with the lithium ion battery cell 10 may be a record of the open circuit voltage of the lithium ion battery cell 10 measured by the sensing unit 120 while the control unit 130 changes SOC of the lithium ion battery cell 10 in a certain SOH within the certain range of 0 to 1. In other words, the control unit 130 may generate the full-cell SOC-OCV profile $U_T(SOC)$ as shown in FIG. 7, based on voltage data provided from the sensing unit 130.

FIG. 8 illustrates voltage averaging. Referring to FIG. 8, the control unit 130 may set, as the full-cell SOC-OCV profile $U_T(SOC)$, a voltage profile $U_{T,A}(SOC)$ corresponding to an average value between an open circuit voltage profile $U_{T,D}(SOC)$ measured while the lithium ion battery cell 10 in a fully charged state (i.e., SOC is 1) is discharged at a certain constant current to a fully discharged state (i.e., SOC is 0) and an open circuit voltage profile $U_{T,C}(SOC)$ measured while the lithium ion battery cell 10 in the fully discharged state is charged at the constant current to the fully charged state.

FIG. 9 illustrates voltage relaxation. The voltage relaxation may be a type of hybrid pulse power characterization (HPPC) discharge test technique. In the voltage relaxation, the lithium ion battery cell 10 is switched to a no load state whenever the SOC of the lithium ion battery cell 10 sequentially reaches pre-determined values in the range of 0 to 1, while the lithium ion battery cell 10 in the fully charged state is discharged at the certain constant current to the fully discharged state. SOC of the lithium ion battery cell 10 may be expressed in a value in which remaining capacity of the lithium ion battery cell 10 is calculated by time-accumulating a current measured by the current sensor 122 while the lithium ion battery cell 10 is discharged, and the remaining capacity is indicated in a range of 0 to 1 or 0% to 100% based on maximum storage capacity corresponding to current SOH.

At a point of time (see each circle in a broken line of FIG. 9) when a pre-determined relaxation time (for example, 1 hour) is passed from each point of time when a state is switched to the no load state, the sensing unit 120 measures a voltage at both ends of the lithium ion battery cell 10. Then, by using an approximation algorithm, such as curve fitting or the like, the full-cell profile $U_T(SOC)$ may be generated from the measured voltage values.

The control unit 130 may generate a full-cell open circuit voltage profile $U_R(SOC, \theta)$ predicted from a battery cell having an arbitrary usage region $\theta = [p_f, p_i, n_f, n_i]$ based on the full-cell SOC-OCV profiles of the plurality of reference cells. In detail, $U_R(SOC, \theta)$ is a full-cell SOC-OCV profile predicted to be shown when SOC of the lithium ion battery cell 10 is adjusted within the certain SOC range, wherein the positive electrode upper limit value is $p_f$, the positive electrode lower limit value is $p_i$, the negative electrode upper limit value is $n_f$, and the negative electrode lower limit value is $n_i$.

Figure 10:
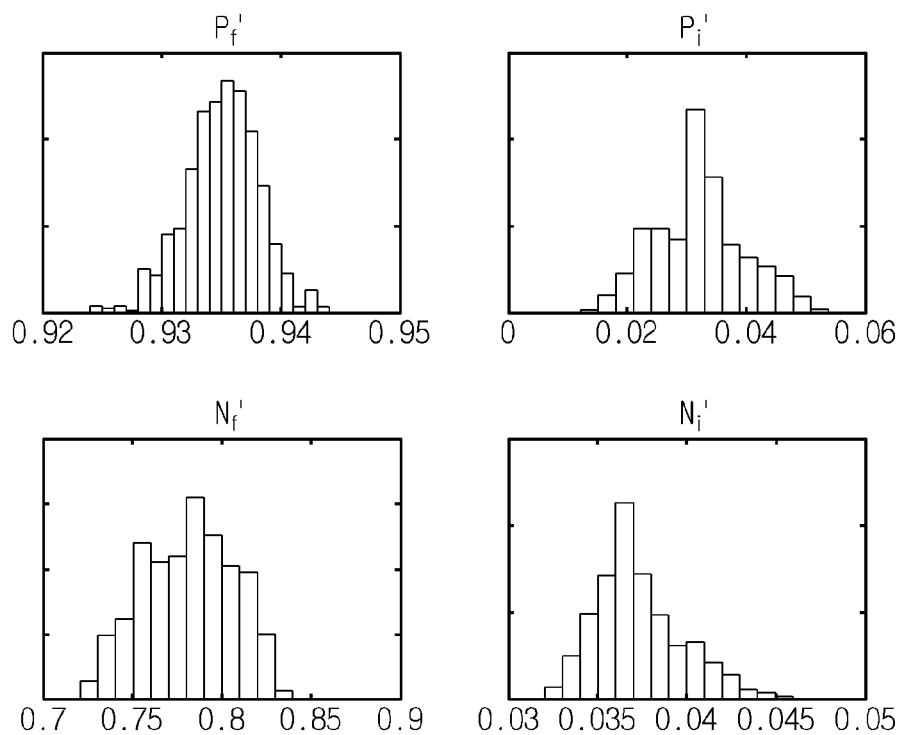
FIG. 10 is a diagram referred to describe a method of estimating a usage region of a lithium ion battery cell in a certain state of health, according to an embodiment of the present disclosure.

FIG. 10 is a diagram referred to describe a method of estimating a usage region of a lithium ion battery cell in a certain SOH, according to an embodiment of the present disclosure.

The control unit 130 may establish a cost function indicating a sum of squares of residual between the full-cell SOC-OCV profile $U_T(SOC)$ of the lithium ion battery cell 10 in the certain SOH and the full-cell open circuit voltage profile $U_R(SOC, \theta)$, by using pre-determined n sample values (n is an integer greater than 1) within the certain SOC range of 0 to 1 as input values. The cost function may be represented in Equation 4 below.

$$S(\theta) = \sum_{i=1}^{n} |U_T(SOC_i) - U_R(SOC_i, \theta)|^2 \quad \text{[Equation 4]}$$

In Equation 4, $SOC_i$ indicates any one of the sample values and $S(\theta)$ indicates the cost function.

For example, let's assume that the full-cell open circuit voltage profile $U_R(SOC, \theta)$ and the full-cell SOC-OCV profile $U_T(SOC)$ are completely matched when an arbitrary $\theta$ is given. In this case, it is obvious that an output value of the cost function is 0, and the control unit 130 may calculate that the usage region of the lithium ion battery cell 10 is equal to $\theta$. In this regard, the control unit 130 may estimate parameters indicating the usage region of the lithium ion battery cell 10, which minimize a value of the cost function through a pre-determined probability model. At this time, the usage region of the lithium ion battery cell 10 having the certain SOH indicates capacity information of at least one of a positive electrode half-cell and a negative electrode half-cell of the lithium ion battery cell 10.

Following algorithms may be used to estimate the usage region of the lithium ion battery cell 10 from the cost function.

1) Gradient base optimization algorithm: fmincon, fminsearch, or the like
2) Global optimization algorithm: simulated annealing or genetic algorithm
3) Markov Chain Monte Carlo (MCMC) algorithm: Metropolis-Hastings, Gibbs Sampling, or the like Obviously, it would be understood that an optimization algorithm or a Bayes estimation technique other than those listed above may be used to estimate the usage region of the lithium ion battery cell 10.

Referring to FIG. 10, histograms indicating posterior distribution respectively with respect to four parameters $P_f'$, $P_i'$, $N_i'$, and defining usage regions of each the positive electrode and the negative electrode of the lithium ion battery cell 10, which are calculated from the cost function by using the probability model, is shown. In each histogram, a horizontal axis indicates a parameter and a vertical axis indicates probability.

For example, the control unit 130 may estimate certain parameters corresponding to a pre-determined rule (for example, having a largest probability value) from each posterior distribution to be a positive electrode upper limit value $p_f'$, a positive electrode lower limit value $p_i'$, a negative electrode upper limit value $n_f'$, and a negative electrode lower limit value $n_i'$.

The control unit 130 may calculate maximum storage capacity of the positive electrode of the lithium ion battery cell 10 in the arbitrary SOH by using Equation 5.

$$Q_P^t = \frac{Q_F^t}{p_f' - p_i'} \quad \text{[Equation 5]}$$

In Equation 5, $Q_F^t$ indicates the maximum storage capacity of the lithium ion battery cell 10 in the arbitrary SOH, $p_f'$ indicates the estimated positive electrode upper limit value of the lithium ion battery cell 10, $p_i'$ indicates the estimated positive electrode lower limit value of the lithium ion battery cell 10, and $Q_P^t$ indicates the maximum storage capacity of the positive electrode of the lithium ion battery cell 10. The control unit 130 may update the maximum storage capacity $Q_F^t$ periodically or non-periodically, based on data provided from the sensing unit 120. In other words, when SOH is changed according to degradation of the lithium ion battery cell 10, $Q_F^t$ may be updated to a new value.

The control unit 130 may calculate maximum storage capacity of the negative electrode of the lithium ion battery cell 10 in the arbitrary SOH by using Equation6.

$$Q_N^t = \frac{Q_F^t}{n_f' - n_i'} \quad \text{[Equation 6]}$$

In Equation 6, $n_f^t$ indicates the estimated negative electrode upper limit value of the lithium ion battery cell 10, $n_i'$ indicates the estimated negative electrode lower limit value of the lithium ion battery cell 10, and $Q_N^t$ indicates the maximum storage capacity of the negative electrode of the lithium ion battery cell 10.

In Equations 5 and 6, it is obvious that $Q_P^t$ and $Q_N^t$ are the quantities of electric charges storable respectively in the positive electrode and the negative electrode of the lithium ion battery cell 10 to the maximum, and are greater than $Q_F^t$ indicating the quantity of electric charge extractable from a full-cell to the maximum.

The control unit 130 may calculate irreversible capacity of the lithium ion battery cell 10 in the arbitrary SOH by using Equation 7.

$$Q_{loss} = Q_P^t \cdot p_i' - Q_N^t \cdot n_i' \quad \text{[Equation 7]}$$

In Equation 7, $Q_{loss}$ indicates the irreversible capacity of the lithium ion battery cell 10. Multiplication of $Q_P^t$ and $P_i'$ indicates irreversible capacity of the positive electrode of the lithium ion battery cell 10 and multiplication of $Q_N^t$ and $n_i'$ indicates irreversible capacity of the negative electrode of the lithium ion battery cell 10. When $Q_{loss}$ is a positive number, the irreversible capacity of the positive electrode of the lithium ion battery cell 10 is relatively greater than the irreversible capacity of the negative electrode of the lithium ion battery cell 10. On the other hand, when $Q_{loss}$ is a negative number, the irreversible capacity of the positive electrode of the lithium ion battery cell 10 is smaller than the irreversible capacity of the negative electrode of the lithium ion battery cell 10.

The control unit 130 may calculate a ratio between the maximum storage capacity of the negative electrode and the maximum storage capacity of the positive electrode of the lithium ion battery cell 10 in the arbitrary SOH by using Equation 8.

$$R_{NP} = \frac{Q_N^t}{Q_P^t} = \frac{p_f' - p_i'}{n_f' - n_i'} \quad \text{[Equation 8]}$$

In Equation 8, $R_{NP}$ indicates the ratio between the maximum storage capacity $Q_N^t$ of the negative electrode of the lithium ion battery cell 10 and the maximum storage capacity $Q_P^t$ of the positive electrode of the lithium ion battery cell 10.

Figure 11:
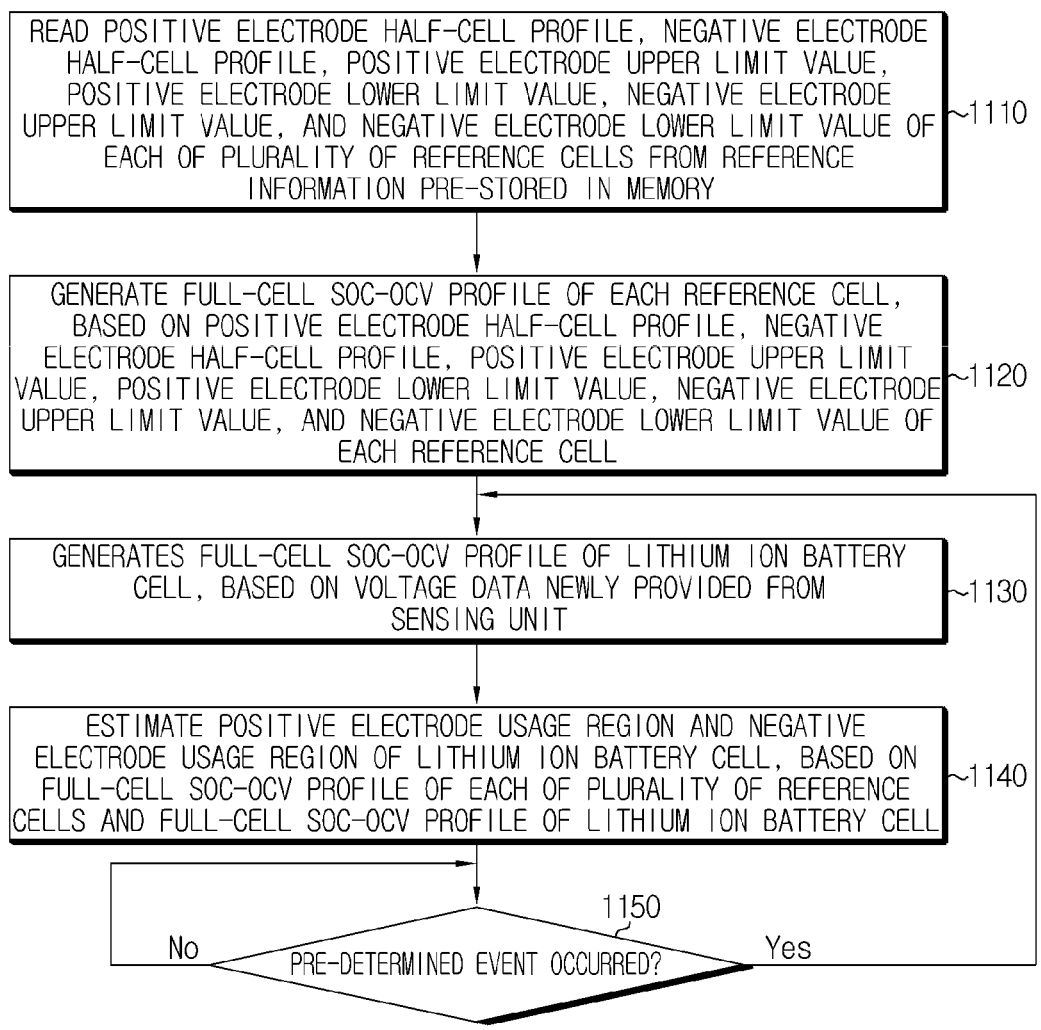
FIG. 11 is a flowchart of a method of obtaining information about a usage region of each of a positive electrode and a negative electrode of a lithium ion battery cell, according to an embodiment of the present disclosure.

FIG. 11 is a flowchart of a method for obtaining information associated with a usage region of each of a positive electrode and a negative electrode of a lithium ion battery cell, according to an embodiment of the present disclosure. Steps shown in FIG. 11 are performed by the apparatus 100 described above.

In step 1110, the control unit 130 reads the positive electrode half-cell profile, the negative electrode half-cell profile, the positive electrode upper limit value, the positive electrode lower limit value, the negative electrode upper limit value, and the negative electrode lower limit value of each of the plurality of reference cells from the reference information pre-stored in the memory 110.

In step 1120, the control unit 130 generates the full-cell SOC-OCV profile of each reference cell, based on the positive electrode half-cell profile, the negative electrode half-cell profile, the positive electrode upper limit value, the positive electrode lower limit value, the negative electrode upper limit value, and the negative electrode lower limit value of each reference cell read in step 1110.

In step 1130, the control unit 130 generates the full-cell SOC-OCV profile of the lithium ion battery cell 10, based on the voltage data newly provided from the sensing unit 120. Whenever step 1130 is performed, the control unit 130 may store the full-cell SOC-OCV profile of the lithium ion battery cell 10 in the memory 110.

In step 1140, the control unit 130 estimates at least one of the positive electrode usage region and the negative electrode usage region of the lithium ion battery cell 10 in the certain SOH, based on the full-cell SOC-OCV profile of each of the plurality of reference cells and the full-cell SOC-OCV profile of the lithium ion battery cell 10. Here, the positive electrode usage region of the lithium ion battery cell 10 is defined by the positive electrode upper limit value and the positive electrode lower limit value. Also, the negative electrode usage region of the lithium ion battery cell 10 is defined by the negative electrode upper limit value and the negative electrode lower limit value.

In step 1150, the control unit 130 determines whether a pre-determined event occurred. Here, the pre-determined even may be, for example, reception of a user command from an external source, a lapse of pre-determined reference time, an increase of a charging and discharging cycle count of the lithium ion battery cell 10 by a certain value, etc. When a result of step 1150 is "YES", the method returns to step 1130. Accordingly, the positive electrode upper limit value, the positive electrode lower limit value, the negative electrode upper limit value, and the negative electrode lower limit value of the lithium ion battery cell 10 may be updated whenever the pre-determined event occurs. In other words, a process including step 1130 and step 1140 is performed at least twice at a time interval, thereby obtaining usage region information when the lithium ion battery cell 10 is relatively less degraded and usage region information when the lithium ion battery cell 10 is relatively more degraded.

For example, after the positive electrode upper limit value, the positive electrode lower limit value, the negative electrode upper limit value, and the negative electrode lower limit value of the lithium ion battery cell 10 are estimated according to steps 1130 and 1140 performed when SOH of the lithium ion battery cell 10 is in a first value (for example, SOH=95%), the positive electrode upper limit value, the positive electrode lower limit value, the negative electrode upper limit value, and the negative electrode lower limit value of the lithium ion battery cell 10 may be estimated according to steps 1130 and 1140 performed again when SOH of the lithium ion battery cell 10 is in a second value smaller than the first value (for example, SOH=85%).

Hereinafter, among two different SOH through which the lithium ion battery cell 10 sequentially passes, larger SOH is referred to as 'first SOH' and smaller SOH is referred to as 'second SOH'. For example, when the first SOH is BOL, the second SOH may be MOL or EOL. As another example, when the first SOH is MOL, the second SOH may be EOL.

The control unit 130 may calculate (i) an amount of change of the maximum storage capacity of the positive electrode and (ii) an amount of change of the maximum discharge capacity of the positive electrode of the lithium ion battery cell 10 with respect to an usage period from the first SOH to the second SOH, based on a positive electrode usage region when the lithium ion battery cell 10 was in the first SOH and a positive electrode usage region when the lithium ion battery cell 10 was in the second SOH. Here, the maximum storage capacity of the positive electrode is the quantity of charge storable in the positive electrode to the maximum. The maximum discharge capacity of the positive electrode is a part of the maximum storage capacity of the positive electrode, and is the quantity of charge dischargeable, to the maximum, from the positive electrode of the lithium ion battery cell 10 that is fully charged.

The control unit 130 may calculate (i) the amount of change of the maximum storage capacity of the positive electrode, by using Equation 9 below.

$$\Delta Q_P^t = Q_{P\_SOH1}^t - Q_{P\_SOH2}^t = \frac{Q_{F\_SOH1}^t}{p_{f\_SOH1} - p_{i\_SOH1}} - \frac{Q_{F\_SOH2}^t}{p_{f\_SOH2} - p_{i\_SOH2}}$$ [Equation 9]

$\Delta Q_P^t$: the amount of change of the maximum storage capacity of the positive electrode of the lithium ion battery cell; 10

$Q_{P\_SOH1}^t$: the maximum storage capacity of the positive electrode of the lithium ion battery cell 10 in the first SOH $Q_{P\_SOH2}^t$: the maximum storage capacity of the positive electrode of the lithium ion battery cell 10 in the second SOH $p_{f\_SOH1}$: the positive electrode upper limit value of the positive electrode usage region estimated in the first SOH $P_{i\_SOH1}^t$: the positive electrode lower limit value of the positive electrode usage region estimated in the first SOH $P_{f\_SOH2}$: the positive electrode upper limit value of the positive electrode usage region estimated in the second SOH $p_{i\_SOH2}$: the positive electrode lower limit value of the positive electrode usage region estimated in the second SOH $Q_{F\_SOH1}^t$: the maximum storage capacity of the lithium ion battery cell 10 in the first SOH $Q_{F\_SOH2}^t$: the maximum storage capacity of the lithium ion battery cell 10 in the second SOH In Equation 9, $\Delta Q_P^t$ indicates a degree of degradation of the positive electrode of the lithium ion battery cell 10 during the usage period from the first SOH to the second SOH.

Also, the control unit 130 may calculate (ii) the amount of change of the maximum discharge capacity of the positive electrode, by using Equation 10 below.

$$\Delta Q_{residual\_P} = Q_{P\_SOH2}^t(1-p_{f\_SOH2}) - Q_{P\_SOH1}^t(1-p_{f\_SOH1})$$ [Equation 10]

$\Delta Q_{residual\_P}$: the amount of change of the maximum discharge capacity of the positive electrode of the lithium ion battery cell 10

In Equation 10, $\Delta Q_{residual\_P}$ may have a tendency to increase as the lithium ion battery cell 10 is degraded, i.e., as a difference between the first SOH and the second SOH is increased.

The control unit 130 may calculate (iii) the amount of change of the maximum storage capacity of the negative electrode and (iv) the amount of change of the maximum discharge capacity of the negative electrode of the lithium ion battery cell 10 with respect to the period from the first SOH to the second SOH, based on the negative electrode usage region when the lithium ion battery cell 10 was in the first SOH and the negative electrode usage region when the lithium ion battery cell 10 was in the second SOH. Here, the maximum storage capacity of the negative electrode is the quantity of charge storable in the negative electrode to the maximum. The maximum discharge capacity of the negative electrode is a part of the maximum storage capacity of the negative electrode and is the quantity of charge dischargeable, to the maximum, from the negative electrode of the lithium ion battery cell 10 that is fully charged.

The control unit 130 may calculate (iii) the amount of change of the maximum storage capacity of the negative electrode, by using Equation 11 below.

$$\Delta Q_N^t = Q_{N\_SOH1}^t - Q_{N\_SOH2}^t = \frac{Q_{F\_SOH1}^t}{n_{f\_SOH1} - n_{i\_SOH1}} - \frac{Q_{F\_SOH2}^t}{n_{f\_SOH2} - n_{i\_SOH2}}$$ [Equation 11]

$\Delta Q_N^t$: the amount of change of the maximum storage capacity of the negative electrode of the lithium ion battery cell 10

$Q_{N\_SOH1}^t$: the maximum storage capacity of the negative electrode of the lithium ion battery cell 10 in the first SOH $Q_{N\_SOH2}^t$: the maximum storage capacity of the negative electrode of the lithium ion battery cell 10 in the second SOH $n_{f\_SOH1}$: the negative electrode upper limit value of the negative electrode usage region estimated in the first SOH $n_{i\_SOH1}$: the negative electrode lower limit value of the negative electrode usage region estimated in the first SOH $n_{f\_SOH2}$: the negative electrode upper limit value of the negative electrode usage region estimated in the second SOH $n_{i\_SOH2}$: the negative electrode lower limit value of the negative electrode usage region estimated in the second SOH $Q_{F\_SOH1}^t$: the maximum storage capacity of the lithium ion battery cell 10 in the first SOH $Q_{F\_SOH2}^t$: the maximum storage capacity of the lithium ion battery cell 10 in the second SOH In Equation 11, $\Delta Q_N^t$ indicates a degree of degradation of the negative electrode of the lithium ion battery cell 10 during the usage period from the first SOH to the second SOH.

The control unit 130 may calculate (iv) the amount of change of the maximum discharge capacity of the negative electrode, by using Equation 12 below.

$$\Delta Q_{residual\_N} = Q_{N\_SOH1}^t \cdot n_{f\_SOH1} - Q_{N\_SOH2}^t \cdot n_{f\_SOH2}$$ [Equation 12]

In Equation 12, $\Delta Q_{residual\_N}$ may have a tendency to increase as the lithium ion battery cell 10 is degraded, i.e., as a difference between the first SOH and the second SOH is increased.

The control unit 130 may calculate consumption capacity by using Equation 13 below.

$$Q_{parasitic} = \Delta Q_{residual\_P} + \Delta Q_{residual\_N}$$ [Equation 13]

In Equation 13, $Q_{parasitic}$ indicates capacity consumed due to a side reaction between the positive electrode and the electrolyte solution and a side reaction between the negative electrode and the electrolyte solution, which lead to consumption of the lithium ions in the lithium ion battery cell 10 during the usage period from the first SOH to the second SOH.

A result calculated by using at least one of Equations 5 through 13 above may be provided to the user through the communication unit 140, as the degradation information of the lithium ion battery cell 10.

Embodiments of the present disclosure described above are not embodied only through an apparatus and a method, but may be embodied through a program realizing a function corresponding to a feature of the embodiments of the present disclosure or a recording medium having recorded thereon the program, and such embodiments may be easily embodied by experts of technical fields to which the present disclosure belongs, from the description of the embodiments described above.

The present disclosure has been described by limited embodiments and drawings, but the present disclosure is not limited thereto, and various changes and modifications are possible within the scope of the disclosure and the equivalent range of appended claims by one of ordinary skill in the art.

Also, since the present disclosure described above may be variously substituted, modified, and changed by one of ordinary skill in the art within the range of the technical ideas of the present disclosure, the present disclosure is not limited by the above-described embodiments and appended drawings, but all or some of the embodiments may be selectively combined for various modifications.

What is claimed is:

1. An apparatus for obtaining degradation information of a lithium ion battery cell, the apparatus comprising:
    a sensing unit configured to measure:
        a full-cell open circuit voltage; and
        a current of the lithium ion battery cell; and
    a controller operably coupled to the sensing unit, the controller being configured to:
        estimate a first positive electrode usage region of the lithium ion battery cell, based on a full-cell open circuit voltage and a current measured by the sensing unit while the lithium ion battery cell is in a first state of health, the first positive electrode usage region being a first range of values;
        estimate a second positive electrode usage region of the lithium ion battery cell, based on an open circuit voltage and a current measured by the sensing unit while the lithium ion battery cell is in a second state of health that is degraded as compared to the first state of health, the second positive electrode usage region being a second range of values; and
        calculate an amount of change of maximum storage capacity of a positive electrode of the lithium ion battery cell with respect to an usage period from the first state of health to the second state of health, based on the first positive electrode usage region and the second positive electrode usage region,
    wherein the first positive electrode usage region is defined by a first positive electrode upper limit value and a first positive electrode lower limit value,
    wherein the second positive electrode usage region is defined by:
        a second positive electrode upper limit value, and
        a second positive electrode lower limit value,
    wherein the first positive electrode upper limit value corresponds to an amount of lithium ions stored in the positive electrode of the lithium ion battery cell when a state of charge of the lithium ion battery cell in the first state of health is at a pre-determined upper limit value,
    wherein the first positive electrode lower limit value corresponds to an amount of lithium ions stored in the positive electrode of the lithium ion battery cell when the state of charge of the lithium ion battery cell in the first state of health is at a pre-determined lower limit value,
    wherein the second positive electrode upper limit value corresponds to an amount of lithium ions stored in the positive electrode of the lithium ion battery cell when the state of charge of the lithium ion battery cell in the second state of health is at the pre-determined upper limit value,
    wherein the second positive electrode lower limit value corresponds to an amount of lithium ions stored in the positive electrode of the lithium ion battery cell when the state of charge of the lithium ion battery cell in the second state of health is at the pre-determined lower limit value,
    wherein the controller is further configured to calculate the amount of change of the maximum storage capacity of the positive electrode of the lithium ion battery cell with respect to the usage period by using an equation below:

$$\Delta Q_P^t = Q_{P\_SOH1}^t - Q_{P\_SOH2}^t = \frac{Q_{F\_SOH1}^t}{p_{f\_SOH1} - p_{i\_SOH1}} - \frac{Q_{F\_SOH2}^t}{p_{f\_SOH2} - p_{i\_SOH2}},$$

where:
        $\Delta Q_P^t$: the amount of change of the maximum storage capacity of the positive electrode of the lithium ion battery cell,
        $Q_{P\_SOH1}^t$: maximum storage capacity of the positive electrode of the lithium ion battery cell in the first state of health,
        $Q_{P\_SOH2}^t$: maximum storage capacity of the positive electrode of the lithium ion battery cell in the second state of health,
        $p_{f\_SOH1}$: the first positive electrode upper limit value,
        $p_{i\_SOH1}$: the first positive electrode lower limit value,
        $p_{f\_SOH2}$: the first positive electrode lower limit value,
        $p_{i\_SOH2}$: the second positive electrode upper limit value,
        $Q_{F\_SOH1}^t$: maximum storage capacity of the lithium ion battery cell in the first state of health, and
        $Q_{F\_SOH2}^t$: maximum storage capacity of the lithium ion battery cell in the first state of health,
    wherein the controller is further configured to calculate an amount of change of maximum discharge capacity of the positive electrode of the lithium ion battery cell with respect to the usage period by using an equation below:

$$\Delta Q_{residual\_P} = Q_P^t\_SOH2(1-p_{f\_SOH2}) - Q_{P\_SOH1}^t(1-p_{f\_SOH1})$$

where $\Delta Q_{residual\_P}$: the change of the maximum discharge capacity of the positive electrode of the lithium ion battery cell, and
    wherein the amount of change of the maximum discharge capacity of the positive electrode of the lithium ion battery cell corresponds to a total amount of lithium ions consumed by a side reaction between the positive electrode and an electrolyte solution during the usage period.

2. The apparatus of claim 1, further comprising a communication unit configured to externally transmit the obtained degradation information.

3. A battery pack comprising the apparatus of claim 1.

4. The apparatus of claim 1, further comprising a memory operably coupled to the controller, the memory being configured to store reference information of each of a plurality of reference cells, the reference information including:
    a positive electrode half-cell profile;
    the first and second positive electrode upper limit values; and
    the first and second positive electrode lower limit values.

5. An apparatus for obtaining degradation information of a lithium ion battery cell, the apparatus comprising:
    a sensing unit configured to measure a full-cell open circuit voltage and a current of the lithium ion battery cell; and
    a controller operably coupled to the sensing unit, the controller being configured to:
        estimate a first negative electrode usage region of the lithium ion battery cell, based on an open circuit voltage and a current measured by the sensing unit while the lithium ion battery cell is in a first state of health, the first negative electrode usage region being a first range of values;
        estimate a second negative electrode usage region of the lithium ion battery cell, based on a full-cell open circuit voltage and a current measured by the sensing unit while the lithium ion battery cell is in a second state of health that is degraded as compared to the first state of health, the second negative electrode usage region being a second range of values; and
        calculate an amount of change of maximum storage capacity of the lithium ion battery cell with respect to an usage period from the first state of health to the second state of health, based on the first negative electrode usage region and the second negative electrode usage region,.
    wherein the first negative electrode usage region is defined by:
        a first negative electrode upper limit value, and
        a first negative electrode lower limit value,
    wherein the second negative electrode usage region is defined by:
        a second negative electrode upper limit value, and
        a second negative electrode lower limit value,
    wherein the first negative electrode upper limit value corresponds to an amount of lithium ions stored in the negative electrode of the lithium ion battery cell when a state of charge of the lithium ion battery cell in the first state of health is at a pre-determined upper limit value,
    wherein the first negative electrode lower limit value corresponds to an amount of lithium ions stored in the negative electrode of the lithium ion battery cell when the state of charge of the lithium ion battery cell in the first state of health is at a pre-determined lower limit value,
    wherein the second negative electrode upper limit value corresponds to an amount of lithium ions stored in the negative electrode of the lithium ion battery cell when the state of charge of the lithium ion battery cell in the second state of health is at the pre-determined upper limit value,
    wherein the second negative electrode lower limit value corresponds to an amount of lithium ions stored in the negative electrode of the lithium ion battery cell when the state of charge of the lithium ion battery cell in the second state of health is at the pre-determined lower limit value,
    wherein the controller is further configured to calculate the amount of change of the maximum storage capacity of the negative electrode of the lithium ion battery cell by using an equation below:

$$\Delta Q_N^t = Q_{N\_SOH1}^t - Q_{N\_SOH2}^t = \frac{Q_{F\_SOH1}^t}{n_{f\_SOH1} - n_{i\_SOH1}} - \frac{Q_{F\_SOH2}^t}{n_{f\_SOH2} - n_{i\_SOH2}},$$

where:
        $\Delta Q_N^t$: the amount of change of the maximum storage capacity of the negative electrode of the lithium ion battery cell, t
        $Q_{N\_SOH1}^t$: maximum storage capacity of the negative electrode of the lithium ion battery cell in the first state of health,
        $Q_{N\_SOH2}^t$: maximum storage capacity of the negative electrode of the lithium ion battery cell in the second state of health,
        $n_{f\_SOH1}$: the first negative electrode upper limit value,
        $n_{i\_SOH1}$: the first negative electrode lower limit value,
        $n_{f\_SOH2}$: l the second negative electrode upper limit value,
        $n_{i\_SOH2}$: the second negative electrode lower limit value,
        $Q_{F\_SOH1}^t$: maximum storage capacity of the lithium ion battery cell in the first state of health, and
        $Q_{F\_SOH2}^t$: maximum storage capacity of the lithium ion battery cell in the first state of health,
    wherein the controller is further configured to calculate an amount of change of maximum discharge capacity of the negative electrode of the lithium ion battery cell with respect to the usage period by using an equation below:

$$\Delta Q_{residual\_N} = Q_{N\_SOH1}^t \cdot n_{f\_SOH1} - Q_{N\_SOH2}^t \cdot n_{f\_SOH2},$$

where $\Delta Q_{residual\_N}$ : the amount of change of the maximum discharge capacity of the negative electrode of the lithium ion battery cell, and
    wherein the amount of change of the maximum discharge capacity of the negative electrode of the lithium ion battery cell corresponds to a total amount of lithium ions consumed by a side reaction between the negative electrode and an electrolyte solution during the usage period.

6. The apparatus of claim 5, further comprising a memory operably coupled to the controller, the memory being configured to store reference information of each of a plurality of reference cells, the reference information including:
    a negative electrode half-cell profile;
    the first and second negative electrode upper limit values; and
    the first and second negative electrode lower limit values.

7. A method of operating an apparatus for obtaining degradation information of a lithium ion battery cell, the apparatus comprising a sensing unit and a controller operably coupled to the sensing unit, the method comprising:
    measuring, by the sensing unit:
        a full-cell open circuit voltage; and
        a current of the lithium ion battery cell; and
    estimating, by the controller, a first positive electrode usage region of the lithium ion battery cell, based on a full-cell open circuit voltage and a current measured by the sensing unit while the lithium ion battery cell is in a first state of health, the first positive electrode usage region being a first range of values;

estimating, by the controller, a second positive electrode usage region of the lithium ion battery cell, based on an open circuit voltage and a current measured by the sensing unit while the lithium ion battery cell is in a second state of health that is degraded as compared to the first state of health, the second positive electrode usage region being a second range of values; and calculating, by the controller, an amount of change of maximum storage capacity of a positive electrode of the lithium ion battery cell with respect to an usage period from the first state of health to the second state of health, based on the first positive electrode usage region and the second positive electrode usage region, wherein the first positive electrode usage region is defined by a first positive electrode upper limit value and a first positive electrode lower limit value, wherein the second positive electrode usage region is defined by:
 a second positive electrode upper limit value, and
 a second positive electrode lower limit value, wherein the first positive electrode upper limit value corresponds to an amount of lithium ions stored in the positive electrode of the lithium ion battery cell when a state of charge of the lithium ion battery cell in the first state of health is at a pre-determined upper limit value, wherein the first positive electrode lower limit value corresponds to an amount of lithium ions stored in the positive electrode of the lithium ion battery cell when the state of charge of the lithium ion battery cell in the first state of health is at a pre-determined lower limit value, wherein the second positive electrode upper limit value corresponds to an amount of lithium ions stored in the positive electrode of the lithium ion battery cell when the state of charge of the lithium ion battery cell in the second state of health is at the pre-determined upper limit value, wherein the second positive electrode lower limit value corresponds to an amount of lithium ions stored in the positive electrode of the lithium ion battery cell when the state of charge of the lithium ion battery cell in the second state of health is at the pre-determined lower limit value;

calculating, by the controller, the amount of change of the maximum storage capacity of the positive electrode of the lithium ion battery cell with respect to the usage period by using an equation below:

$$\Delta Q_P^t = Q_{P\_SOH1}^t - Q_{P\_SOH2}^t = \frac{Q_{F\_SOH1}^t}{p_{f\_SOH1} - p_{i\_SOH1}} - \frac{Q_{F\_SOH2}^t}{p_{f\_SOH2} - p_{i\_SOH2}},$$

where:
 $\Delta Q_F^t$: the amount of change of the maximum storage capacity of the positive electrode of the lithium ion battery cell,
 $Q_{P\_SOH1}^t$: maximum storage capacity of the positive electrode of the lithium ion battery cell in the first state of health,
 $Q_{P\_SOH2}^t$: maximum storage capacity of the positive electrode of the lithium ion battery cell in the second state of health,
 $P_{f\_SOH1}$: the first positive electrode upper limit value,
 $P_{i\_SOH1}$: the first positive electrode lower limit value,
 $P_{f\_SOH2}$: the second positive electrode upper limit value,
 $P_{i\_SOH2}$: the second positive electrode lower limit value,
 $Q_{F\_SOH1}^t$: maximum storage capacity of the lithium ion battery cell in the first state of health, and
 $Q_{F\_SOH2}^t$: maximum storage capacity of the lithium ion battery cell in the first state of health; and calculating, by the controller, an amount of change of maximum discharge capacity of the positive electrode of the lithium ion battery cell with respect to the usage period by using an equation below:

$$\Delta Q_{residual\_P} = Q_{P\_SOH2}^t(1 - p_{f\_SOH2}) - Q_{P\_SOH1}^t(1 - p_{f\_SOH1}),$$

where $\Delta Q_{residual\_P}$: the change of the maximum discharge capacity of the positive electrode of the lithium ion battery cell, wherein the amount of change of the maximum discharge capacity of the positive electrode of the lithium ion battery cell corresponds to a total amount of lithium ions consumed by a side reaction between the positive electrode and an electrolyte solution during the usage period.

8. A method of operating an apparatus for obtaining degradation information of a lithium ion battery cell, the apparatus comprising a sensing unit and a controller operably coupled to the sensing unit, the method comprising:

measuring, by the sensing unit, a full-cell open circuit voltage and a current of the lithium ion battery cell;

estimating, by the controller, a first negative electrode usage region of the lithium ion battery cell, based on an open circuit voltage and a current measured by the sensing unit while the lithium ion battery cell is in a first state of health, the first negative electrode usage region being a first range of values;

estimating, by the controller, a second negative electrode usage region of the lithium ion battery cell, based on a full-cell open circuit voltage and a current measured by the sensing unit while the lithium ion battery cell is in a second state of health that is degraded as compared to the first state of health, the second negative electrode usage region being a second range of values;

and calculating, by the controller, an amount of change of maximum storage capacity of the lithium ion battery cell with respect to an usage period from the first state of health to the second state of health, based on the first negative electrode usage region and the second negative electrode usage region, wherein the first negative electrode usage region is defined by:
 a first negative electrode upper limit value, and
 a first negative electrode lower limit value, wherein the second negative electrode usage region is defined by:
 a second negative electrode upper limit value, and
 a second negative electrode lower limit value, wherein the first negative electrode upper limit value corresponds to an amount of lithium ions stored in the negative electrode of the lithium ion battery cell when a state of charge of the lithium ion battery cell in the first state of health is at a pre-determined upper limit value, wherein the first negative electrode lower limit value corresponds to an amount of lithium ions stored in the negative electrode of the lithium ion battery cell when the state of charge of the lithium ion battery cell in the first state of health is at a pre-determined lower limit value, wherein the second negative electrode upper limit value corresponds to an amount of lithium ions stored in the negative electrode of the lithium ion battery cell when the state of charge of the lithium ion battery cell in the second state of health is at the pre-determined upper limit value, wherein the second negative electrode lower limit value corresponds to an amount of lithium ions stored in the negative electrode of the lithium ion battery cell when the state of charge of the lithium ion battery cell in the second state of health is at the pre-determined lower limit value;

calculating, by the controller, the amount of change of the maximum storage capacity of the negative electrode of the lithium ion battery cell by using an equation below:

$$\Delta Q_N^t = Q_{N\_SOH1}^t - Q_{N\_SOH2}^t = \frac{Q_{F\_SOH1}^t}{n_{f\_SOH1} - n_{i\_SOH1}} - \frac{Q_{F\_SOH2}^t}{n_{f\_SOH2} - n_{i\_SOH2}},$$

where:
- $\Delta Q_N^t$: the amount of change of the maximum storage capacity of the negative electrode of the lithium ion battery cell,
- $Q_{N\_SOH1}^t$: maximum storage capacity of the negative electrode of the lithium ion battery cell in the first state of health,
- $Q_{N\_SOH2}^t$: maximum storage capacity of the negative electrode of the lithium ion battery cell in the first state of health,
- $n_{f\_SOH1}$: the first negative electrode upper limit value,
- $n_{i\_SOH1}$: the first negative electrode lower limit value,
- $n_{f\_SOH2}$: the second negative electrode upper limit value,
- $n_{i\_SOH2}$: the second negative electrode lower limit value,
- $Q_{F\_SOH1}^t$: maximum storage capacity of the lithium ion battery cell in the first state of health, and
- $Q_{F\_SOH2}^t$: maximum storage capacity of the lithium ion battery cell in the first state of health, and calculating, by the controller, an amount of change of maximum discharge capacity of the negative electrode of the lithium ion battery cell with respect to the usage period by using an equation below:

$$\Delta Q_{residual\_N} = Q_{N\_SOH1}^t \cdot n_{f\_SOH1} - Q_{N\_SOH2}^t \cdot n_{f\_SOH2},$$

where $\Delta Q_{residual\_N}$: the amount of change of the maximum discharge capacity of the negative electrode of the lithium ion battery cell, wherein the amount of change of the maximum discharge capacity of the negative electrode of the lithium ion battery cell corresponds to a total amount of lithium ions consumed by a side reaction between the negative electrode and an electrolyte solution during the usage period.

* * * * *